United States Patent [19]

Potts et al.

[11] Patent Number: 5,633,879
[45] Date of Patent: May 27, 1997

[54] METHOD FOR INTEGRATED CIRCUIT DESIGN AND TEST

[75] Inventors: David J. Potts, Houston, Tex.; John Ribe, West Chicago, Ill.; Kevin L. Kornher; Roger Griesmer, both of Dallas, Tex.

[73] Assignee: Texas Instruments Incorporated, Dallas, Tex.

[21] Appl. No.: 591,256

[22] Filed: Jan. 19, 1996

[51] Int. Cl.⁶ .................................................. G06F 11/00
[52] U.S. Cl. ................................................ 371/27; 371/25.1
[58] Field of Search ........................... 371/27, 22.1, 22.5, 371/22.6, 25.1, 28

[56] References Cited

U.S. PATENT DOCUMENTS

| 4,620,302 | 10/1986 | Binoeder et al. | 371/25.1 |
| 5,519,879 | 5/1996 | Carmon | 395/800 |

Primary Examiner—Vincent P. Canney
Attorney, Agent, or Firm—J. Dennis Moore; James C. Kesterson; Richard L. Donaldson

[57] ABSTRACT

A method for testing an integrated circuit using a tester. The tester has internal periods for timing reference. The integrated circuit has one or more input ports, one or more output ports and a logic circuit disposed between the input ports and the output ports. The tester applies an input signal to one or more of the input ports, the input signal being synchronous to the internal periods of the tester, such that, by the operation of the logic circuit, an output signal appears at one or more of the output ports. The method comprises the following steps. First, a first output port is selected having a predetermined signal event that occurs at the first output port during a predetermined time range, the predetermined time range being determined with respect to the internal period. Then, the predetermined signal event is used as a timing reference for a test event of the integrated circuit, the test event occurring a predetermined time interval from the predetermined event.

25 Claims, 3 Drawing Sheets

METHOD FOR INTEGRATED CIRCUIT DESIGN AND TEST

TECHNICAL FIELD OF THE INVENTION

This invention relates to methods and apparatus for designing and testing integrated circuits.

BACKGROUND OF THE INVENTION

Introduction:

Integrated circuit design systems and test systems are closely related, in system implementation. Integrated circuit design is now routinely done utilizing computer programs that provide a design simulation environment that provides the circuit designer with a graphical user interface with which the designer enters data representing the logical relationships that the design is intended to implement. In response to such data, the program determines an efficient assemblage of semiconductor devices, in accordance with the process technology and logic circuit library with which the design simulation environment is used, and models various parameters of this resulting circuit. These parameters include signals at various points in the resulting circuit, including output ports, that arise as a result of a given stimulus of input signal or signals, and the relative timings thereof.

In turn, the circuit data and parameter data from the design system are used in related test systems to generate a sequence of data values for input at one or more input ports and to generate an expected sequence of data values at one or more output ports for a properly operating circuit. These related input and output test data are sometimes referred to as test vectors.

The tools just described greatly facilitate and shorten the time necessary to design circuits for integrated circuit fabrication, and the time to test the circuit so fabricated. However, even with these highly sophisticated tools, nonetheless integrated circuit designers still contend with various problems in integrated circuit test. For example, integrated circuit test engineers and designers must contend with the problems created by variations in signal paths, or delay paths, throughout a device.

As system clock frequency increases and the design grows in complexity, not only do absolute delays through the circuit in the various delay paths grow, but their magnitude relative to the system clock period increases as well. Consequently, variations in fabrication process, voltage and temperature can often produce changes greater than 400% on a given delay path. Nonetheless, while seemingly large, variations of this magnitude can be completely acceptable in many applications and are easily comprehended in the simulation environment. However, beyond the simulation environment, these delay variations greatly reduce the testability of high speed designs.

One reason for this is that prior art vector generation and test tools utilize a fixed timing reference point, i.e., clock-in or clock-out, with which to reference a timing reference window in which an output port is monitored for an expected signal during test. When using only a fixed timing reference point, it is not possible to compensate for delay variations that are large with respect to the reference window. For example, if the delay variations are large enough, the testability is reduced or completely lost when signals cross over reference boundaries between minimum, or rain, and maximum, or max, conditions.

FIG. 1 is a signal timing diagram showing an example of lost test coverage using a fixed reference window, based on a dock-in reference point. The fixed reference window in this example is based on the clock-in signal, CLKIN, which is a clock signal, or dock, applied to an input pin of the integrated circuit. The output being examined, CLKOUT, is a clock appearing on an output pin of the integrated circuit that is a function of both the low-high transition and the high-low transition on CLKIN as well as some variable delay path through the device. The CLKOUT signal is shown for both rain and max delay path conditions. The region between lines 10 and 12 represents the overlap of CLKOUT, from rain to max conditions. From FIG. 1, we can see that CLKOUT is unrestable at any point in the region between lines 10 and 12 due to the ambiguity between the rain and max values on this signal.

Clock-In Based Testing:

The standard approach to vector generation and testing is the fixed reference method discussed above. One version of this method, commonly referred to as clock-in based testing, simply requires an input clock to be the standard reference point in vector generation and testing. This fixed reference method, illustrated above in connection with FIG. 1, works well on slower synchronous designs; but, as previously discussed, this method is limited as the device frequency increases and the design grows in complexity.

Clock-Out Based Testing:

An alternative to clock-in based testing is clock-out based testing. Clock-out based testing uses the same fixed reference principle as clock-in based testing. However, in this second method the clock-out signal is used as the standard reference point. It is up to the test engineers or designers to derive techniques for synchronizing the test equipment with the clock-out signal of the device. Once synchronized, then the test patterns can be run with the clock-out based timing information. This method works well for devices which only need the clock-out reference, but cannot be used to test devices which also require signal timings with respect to a clock-in or other timing reference. Similar to the clock-in approach, this clock-out method cannot handle the high-speed or embedded devices which require multiple timing references.

Alternative Approach:

Another approach has been proposed that can also handle the rain to max delay variations that negatively effect testability. This other approach is to simply use two sets of test vectors for both min and max conditions. Set one of these vectors is used only under minimum voltage/temperature/process (VTP) conditions; while set two is used only under maximum VTP conditions. This two pattern approach helps to improve testability, but has several obvious implementation and test time disadvantages.

The first problem with the two set method is the discrepancies in controllable parameters between the simulation and the test environment. Simulations are run with specified values of voltage, temperature and process parameters. While testing is done only under control of voltage and temperature, the process parameters on a real device are fixed during fabrication within an allowable minimum to maximum range, and cannot be modified when testing the device. Acknowledging this difference, two simulations have to be done at each fixed voltage and temperature under both min and max process conditions. The two separate simulations then have to be used for vector generation which is only valid at the given voltage and temperature. Using this method requires doubling the needed number of simulations at each voltage and temperature. Aside from doubling the number of simulations, the second problem is that this approach also doubles the number of patterns needed to test the device. The resultant simulation and test time impact of this approach makes it impractical.

The present invention overcomes these problems, and provides a method for testing an integrated circuit that provides testability of integrated circuits over significantly greater delay path variations than allowed by prior art test systems. In addition, the present invention provides improved testability for integrated circuits in which integrated circuit types having traditionally differing test methodologies are combined.

SUMMARY OF THE INVENTION

The present invention provides a method for testing an integrated circuit using a tester. The tester has internal periods for timing reference, the integrated circuit having one or more input ports, one or more output ports and a logic circuit disposed between the input ports and the output ports. The tester applies an input signal to one or more of the input ports, the input signal being synchronous to the internal periods of the tester, such that, by the operation of the logic circuit, an output signal appears at one or more of the output ports. The method comprises the following steps. First, a first output port is selected having a predetermined signal event that occurs at the first output port during a predetermined time range, the predetermined time range being determined with respect to the internal period. Then, the predetermined signal event is used as a timing reference for a test event of the integrated circuit, the test event occurring a predetermined time interval from the predetermined event.

These and other features of the invention that will be apparent to those skilled in the art from the following detailed description of the invention, taken together with the accompanying drawings.

DETAILED DESCRIPTION OF THE PREFERRED EMBODIMENT

General Theory of Operation:

The preferred embodiment provides a new test method which has the capability of using multiple dynamic timing references during vector generation and test. With this new test method, the test engineer or designer can use any dynamic reference on the device as a reference point for signal timings. In the prior art clock-in methodology, all clock-in events are defined by the tester cycle. Therefore, the internal tester cycle is, by definition, synchronized with the input clock signal. The timings of all signals are made with respect to the internal tester cycle, and are fixed relative to such internal tester cycle. In the prior art clock-out methodology, the internal tester cycle is synchronized to an output clock signal. Then, as in clock-in methodology, the timings of all signals are made with respect to the internal tester cycle, and are fixed relative to such internal tester cycle. With the preferred embodiment, however, the timings of test signals need not be fixed relative to the internal test cycle. Rather, test signals can be either dynamically related to the internal tester cycle or fixed relative to such tester cycle.

By mixing the normal fixed reference (i.e., clock-in or clock-out) with the new dynamic reference capability, the rain to max delay issues on a device are eliminated as a testability concern and a single test pattern is created that works over the full operating and process conditions. This dynamic reference concept allows the linking of multiple fixed and dynamic timing references within a single test pattern.

Figure 2:
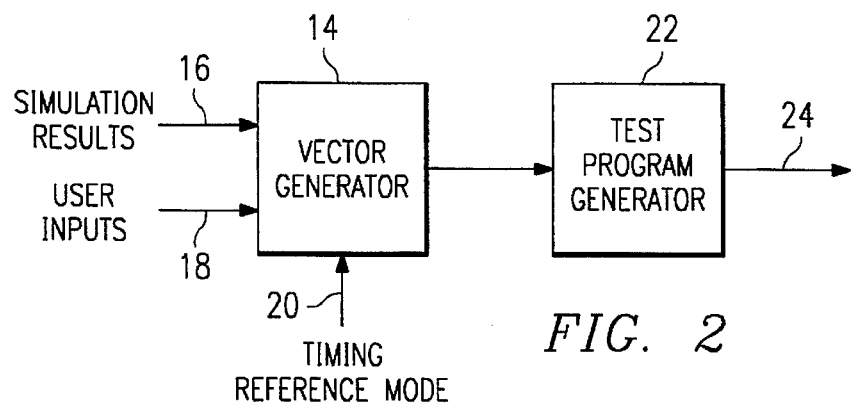
FIG. 2 is a high level block diagram showing the interrelationship of the vector generator and the test program generator.

This multiple dynamic reference concept has been used to develop new design and test tools. The main design tool is the vector generator, which generates test vectors in a single fixed or multiple dynamic timing reference mode. The test program generator can also support this multiple dynamic reference mode. FIG. 2 is a high level block diagram showing the interrelationship of these two tools. A vector generator 14 receives simulation results 16 in the form of a simulation trace file, for example a Verilog® value change dump file, or "VCD" file for short, a Mentor Graphics® Log file, or similar type file; user inputs 18 in the form of command line switches, environment variables and the design netlist; and a timing reference template 20 specifying the fixed timing reference and/or multiple dynamic timing references. The output of the vector generator 14, which is in the form of a prior art test description language, with added fields to accommodate the dynamic reference point capability, described herein, is provided to a test program generator 22, which provides an output 24 that is a test program using the single and/or multiple dynamic timing references.

Figure 1:
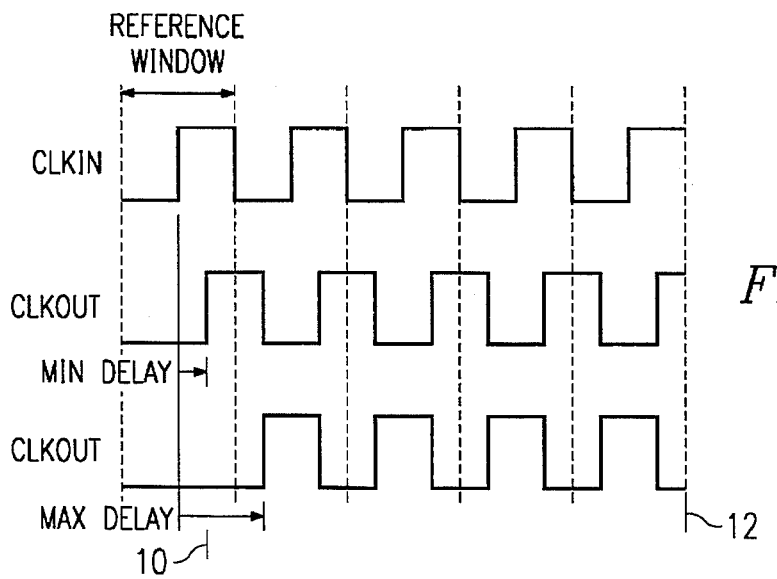
FIG. 1 is a signal timing diagram showing an example of lost test coverage using a fixed reference window, based on a clock-in reference point.
Figure 3:
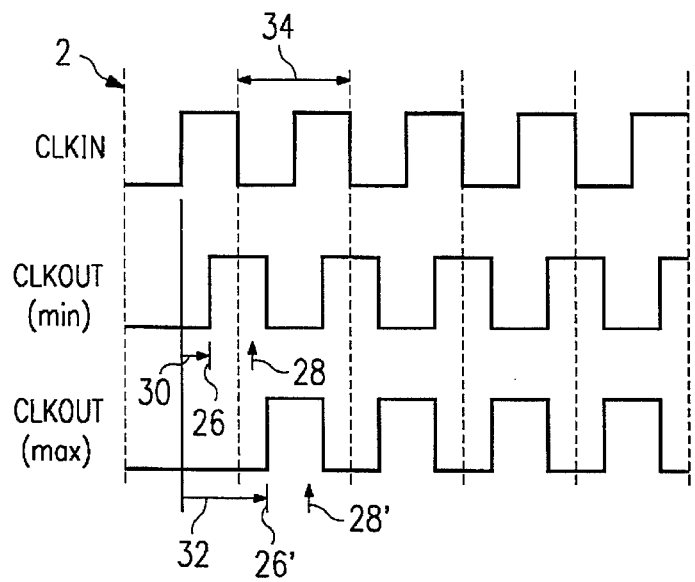
FIG. 3 is a signal timing diagram showing an example of the application of the principles of the preferred embodiment of the present invention.

An example of the "dynamic reference" concept is shown in FIG. 3 solving the problem presented earlier. From FIG. 1, we saw that CLKOUT was untestable over rain and max conditions due to the non-overlap of the simulation results. However, by setting a dynamic reference to be the low-high transition on CLKOUT, then an output strobe for CLKOUT can be set up with respect to this dynamic reference. FIG. 3 illustrates that if the CLKOUT low-high transition 26, 26', is set to be the dynamic reference, rather than the fixed low-high transition 25 of CLKIN, then the strobe placement 28, 28', is just a constant offset from this reference. Note the large difference between the min delay 30 and max delay 32, relative to the clock period 34. In spite of this considerable difference, the CLKOUT pin is clearly testable under these circumstances.

Any output port, such as the pin carrying CLKOUT, or any number of ports can be chosen to be a dynamic reference. Each dynamic reference is tied to the fixed reference by the inclusion of a delay variable. This delay variable is a function of the operating conditions and will be simulated in the design environment and measured per device in the test environment. This method saves considerable time in the simulation and test environments over the alternate approach presenter earlier.

Note that in this context, the term "port" is used to designate any point by which any signal, such as an input data signal, input clock signal, etc., can be applied to a circuit as an input, or at which a signal generated by the circuit, such as an output signal, output clock signal, internal signal to be monitored, etc., can be detected. Integrated circuit component pins are common ports, but other electrical contact points may be used, such as an electrical pad on an integrated circuit chip, whether pre- or post-dicing, for example. Sometimes in this document the term "pin" is used interchangeably with the term "port". The intent is that the broadest possible meaning, i.e., "port" be given with all such usages.

The use of multiple timing references during vector generation and test will improve testability in a wide array of applications.

i.e.:

high speed testing; where delay paths are long compared to input clock duration.

embedded device designs; requiting multiple reference points.

interface testing; asynchronous logic, memory, and other ports which require a "sync-up" point.

Vector Generator

Figure 4:
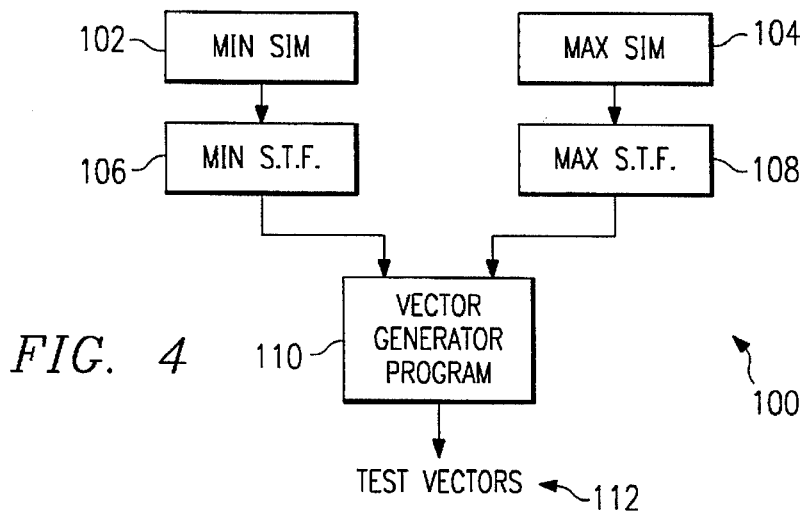
FIG. 4 is a block diagram showing a high level arrangement of elements in the process of a prior art vector generator.

The vector generator of the preferred embodiment of the present invention is built upon a prior art vector generator. The high level arrangement of elements in the process of the prior art vector generator 100 is shown in FIG. 4. As is known, the test vectors 112 are generated by examining the current cycle information of both the rain and max simulations 102, 104, respectively. The test engineer or designer creates a file for each of the min and max simulations, Min Simulation Trace File 106, and Max Simulation Trace File 108, containing signal data representing signal transitions and their relative timing for the device under test, hereinafter referred to as the "DUT". These files are fed into the test vector generator program 110, which generates the desired test vectors 112.

As mentioned above, the prior art test vector generator 100 is unable to handle signals with large min to max delay variations with respect to the cycle period. An example of this problem is illustrated in detail by the signal timing diagram shown in FIG. 5. The output signal to be tested is signal Q. The strobe point, at which the Q signal level is to be examined, is assigned to be T/2, e.g., 113, where T is the period of the system clock. Numbered, sequential cycles of the system clock are shown across the top of FIG. 5. The signal levels for Q are shown for the rain simulation conditions 114 and for the max simulation conditions 116. The Min Simulation Trace File data values 118 and the Max Simulation Trace File data values 120 for each cycle are shown below the respective min simulation conditions 114 and max simulation conditions 116. The test vector data values 122 for each cycle are shown at the bottom of the figure.

Figure 5:
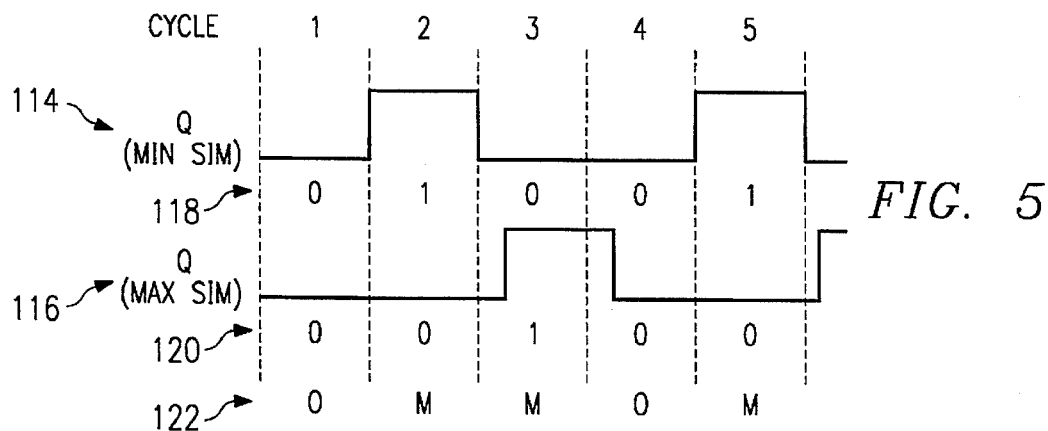
FIG. 5 is a signal timing diagram showing untestability problems associated with prior art test methodologies.

From FIG. 5, it can be seen that the delay from rain to max conditions results in Q shifting more than a full period in the simulation. Due to the delay effects seen on Q, the Min Simulation Trace File data values 118 and the Max Simulation Trace File data values 120 do not match in three of the five cycles, and the data cannot be tested in these cycles, as represented by M in FIG. 5. Note that M stands for "mask", i.e., the test results should be masked, and not relied on for this cycle. This prior art analysis process is represented, in tabular form, where MIN S.T.F. and MAX S.T.F. are the Min Simulation Trace File data values 118 and the Max Simulation Trace File data values 120, respectively, are shown in Table 1:

TABLE 1

| CYCLE | MIN S.T.F. | MAX S.T.F. | TEST VECTOR |
|---|---|---|---|
| 1 | 0 | 0 | 0&0 = 0 (strobe low) |
| 2 | 1 | 0 | 1&0 = M (untestable) |
| 3 | 0 | 1 | 0&1 = M (untestable) |
| 4 | 0 | 0 | 0&0 = 0 (strobe low) |
| 5 | 1 | 0 | 1&0 = M (untestable) |

Figure 6:
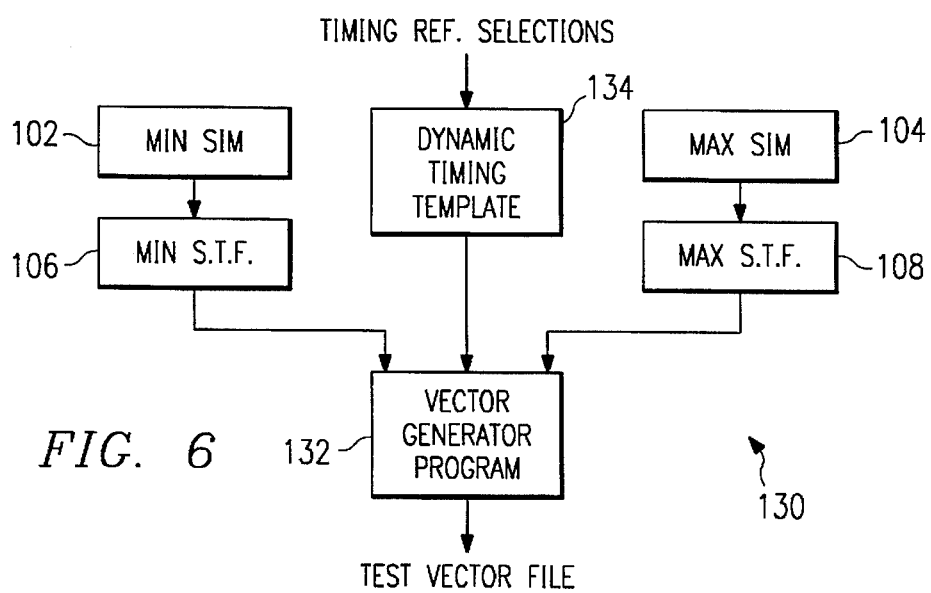
FIGS. 6 and 7 show high level arrangements of the process elements using the vector generator of the preferred embodiment of the present invention.
Figure 7:
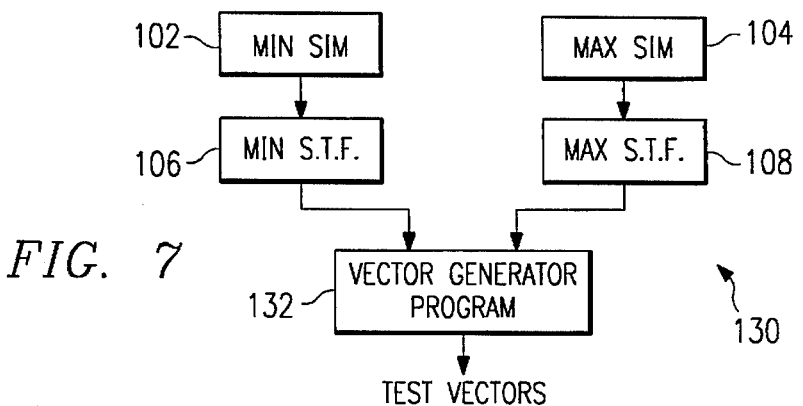

FIGS. 6 and 7 show high level arrangements of the process elements using the vector generator of the preferred embodiment of the present invention 130. The rain and max simulations 102, 104, and the Min Simulation Trace File 106, and Max Simulation Trace File 108, in both FIGS. 6 and 7, are the same as in FIG. 4. New in FIGS. 6, in accordance with the preferred embodiment of the present invention, however, is a new template, which may be referred to as the Dynamic Timing Template 134, which is constructed by the test engineer or designer from certain timing reference selections, as described in more detail below. The Dynamic Timing Template 134 is provided as an input to a modified Vector Generator Program 182, additional to the outputs of the Min Simulation Trace File 106, and Max Simulation Trace File 108.

Before the final adjusted vectors can be generated, however, a set of intermediate test vectors must be generated, whose purpose is to measure and thereby determine the timing of the dynamic reference points. From the outputs of the Min Simulation Trace File 106, and Max Simulation Trace File 108, and inputs from the design engineer, a file containing a set of intermediate test vectors is constructed (see Listing 1, below). This file includes, in addition to the prior art vector data, additional lines that specify the dynamic reference point measurements to be made.

Then, the actual measurements for the dynamic reference points are made, by supplying the above-mentioned a file containing a set of intermediate test vectors, and the Min Simulation Trace File 106, and Max Simulation Trace File 108 to the vector generator. The data from these measurements is added to the file (see Listing 2, below).

Finally, the intermediate test vectors, including the dynamic reference points measurements, along with the Dynamic Timing Template 134 and the Min Simulation Trace File 106, and Max Simulation Trace File 108, are supplied to the vector generator program to generate a final, adjusted test vector file, or test file (see Listing 3, below), to actually test the DUT. Examples of the contents of a test file containing intermediate test vectors, such a test file including dynamic reference point measurement data, and a final, adjusted test file are presented and explained in detail below in conjunction with Listing 1, Listing 2 and Listing 3.

The Dynamic Timing Template 134 contains timing reference information on a pin by pin basis. Table 2 gives an abbreviated example of the contents of a Dynamic Timing Template 134:

TABLE 2

| PIN NAME | PIN TYPE | TIMING = OFFSET (+ optional DYNAMIC REFERENCE POINT) |
|---|---|---|
| D | INPUT | 0.0 ns |
| CLK | INPUT | 5.0 ns |

TABLE 2-continued

| PIN NAME | PIN TYPE | TIMING = OFFSET (+ optional DYNAMIC REFERENCE POINT) |
| --- | --- | --- |
| CLKOUT | OUTPUT | 5.0 ns + TD1 |
| Q | OUTPUT | 6.0 ns + TD1 |

The Dynamic Timing Template 134 (FIG. 6) allows each pin in the device to be assigned a reference point to be used in the vector generator. The reference point can be simply the standard clock-in reference used in simulation, or it can be any other dynamic reference point chosen by the test engineer or designer. The term "dynamic reference point" used in this context means a signal reference point, such as a transition, or edge, that may vary in time with respect to a fixed input reference signal, such as a system clock. This is used as a dynamic reference for a strobe to drive an input event on a pin or to strobe for an output event on a pin. In Table 2, D and CLK use a standard clock-in timing reference. CLKOUT and Q use the dynamic timing reference called TD1. This dynamic reference can be the occurrence of any output event specified by the test engineer or designer.

The "dynamic reference" capability of the preferred embodiment permits one to improve testability on many high-speed integrated circuit designs, as explained above, and can be a positively enabling technique where two or more different circuit designs are combined in a single integrated circuit, where those designs are tested traditionally by different test methodologies, such as clock-in and clock-out. For example, the digital signal processor ("DSP") is traditionally tested using a clock-out methodology, while standard ASICs are traditionally tested using a clock-in methodology. The preferred embodiment can be used to provide more complete testability of integrated circuits combining the two, for example where the DSP forms a "core" around which customized ASIC circuitry is built.

By comparing FIG. 4 with FIGS. 6 and 7, it can be seen that the vector generation methodology changes the vector generation flow in several ways. According to the preferred embodiment, there are now three distinct modes of operation:

1. Intermediate test vector generation mode,
2. Dynamic reference point measurement mode, and
3. Final test vector generation mode.

In the first of these three modes, the vector generator program 130 is used to create a set of intermediate test vectors. These intermediate test vectors are used to define, by measuring and storing, the dynomic reference point for both the simulation flow and the test hardware. This flow is similar to that shown in FIG. 4.

In the second of these three modes, using the intermediate test vectors from step 1, and the minimum and maximum simulation trace files, the vector generator measures and records the dynsmic reference point or points. This data representing the dynomic reference point or points is stored with the intermediate vectors for later use, either together in the same file, or in a different file, as desired.

In the third of these three modes, the vector generator program 130 references each intermediate test vector, including the data representing the dynamic reference point or points, to create the final test vectors. The final test vector is a test vector that uses the dynamic reference points. Each signal in the final test vector can be the standard clock-in based timing or can use a dynamic c reference point to determine the timing of such signal.

As mentioned above, the use of a dynamic reference point by the Dynamic Timing template allows the improvement of testability on many high-speed designs. FIG. 8(A)–(C) demonstrates the testability impact of the application of the preferred embodiment of the present invention on test methodologies of the kind discussed herein.

In FIG. 8(A)–(C), the output signal under test is the signal Q. The first rising edge of CLKOUT is defined as the dynamic reference point, DRP1 140, 142. The strobe on Q is defined to occur shortly after the event DRP1. Since the DRP1 event can be calculated in simulation for both the rain 140 and max 142 cases, the Min Simulation Trace File 106, and Max Simulation Trace File 108 (FIG. 6) data values for each cycle, shown in FIG. 8(A) as S.T.F. (min) and in FIG. 8(B) as S.T.F. (max), respectively, can be created in each case by simply shifting 144, 145, the max case of any signal that uses the dynamic reference point by the difference, or delta, between the rain and max values of DRP1. Such signals can, of course, include the signal that includes the dynamic reference point event itself, if the dynamic reference point is used to test that signal. The shifted signals are shown in FIG. 8(C) for Q and CLKOUT, and identified as S.T.F. (shifted max). After shifting the Max Simulation Trace File the traditional, prior art, rain/max vector generator analysis can be used to determine the final test vector values, identified in FIG. 8(C) as Test Vector. Note that the masks M illustrated in connection with FIG. 3 do not appear in Test Vector in FIG. 8(C). This is illustrated in FIG. 8(C) for both the S.T.F. (min) and S.T.F. (max), data points.

For example, in cycle 1, at min conditions the Q strobe event 146 is found immediately after the DRP1 event 140 in the same cycle, as shown in FIG. 8(A). However, for the Max Simulation Trace File data of cycle 1, the DRP1 event 142 does not occur until cycle 2, and the Q strobe event 148 does not occur until cycle 3. The Test File and the vector generator program effectively look ahead for the DRP1 event and no longer are constrained by the cycle boundaries. This capability results in the test vector sequence shown in FIG. 8(C). As can be seen, the Q strobe event 148 has been "pulled back" in time to time 150. The same Q strobe event 150 of FIG. 8(B) is shown as Q strobe event 152 in FIG. 8(C). The same is shown for the other cycles, cycles 2–5. This test vector now provides testability for the Q signal in all five cycles, compared to the two out of five cycles using a prior art system, and will work over the rain and max conditions.

After the above is performed, the next step is to perform an analysis on all signal timings. The analysis routine allows the test engineer or designer to evaluate the selection of signal timings by getting immediate feedback on possible improvements. The analysis routine is described in detail below. The analysis can be performed on both conventional, fixed timings as well as on the vector generator dynsmic timings. The analysis involves the creation of a histogram. This is done using mostly known, prior art steps. However, the following modification should be made to the histogram generation routine. That modification is that the examination window for the samplings should be expanded beyond a single cycle to whatever is necessary to accommodate the extent of dynamic reference point offset. Thus, if the modifications made to provide dynamic reference point offset in accordance with the present invention allow up to a three cycle offset, then the examination window for the histogram samplings should be four cycles wide. A short summary of the analysis function is now presented.

The analysis function of the preferred embodiment:
evaluates the miss rate of current strobe selection, where the "miss rate" is the number of untestable cycles on the output waveform;

arbitrarily selects other strobe points in the strobe window and evaluates each miss rate; and creates histograms of miss rate vs. strobe timings.

Figure 9:
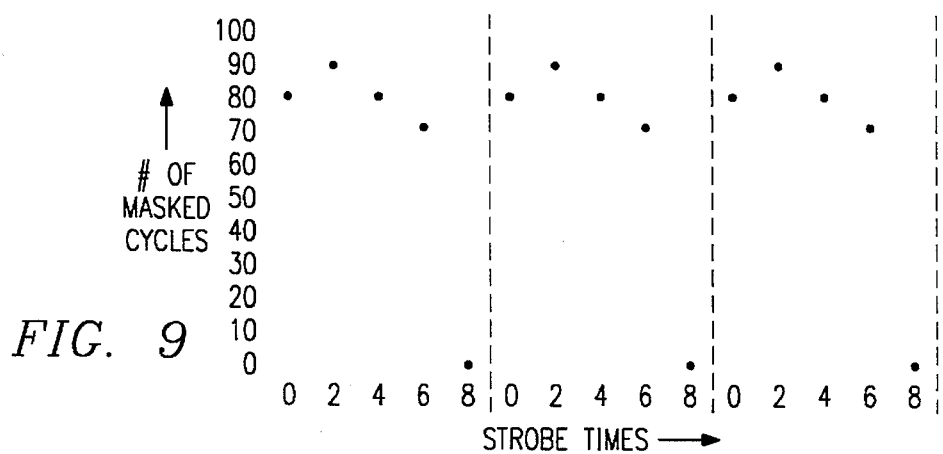
FIG. 9 is a histogram of miss rate vs. strobe timings, useful in selecting the best strobe time for a signal under test.

An example of such a histogram is shown in FIG. 9. In FIG. 9 the vertical axis represents the number of masked cycles, while the horizontal axis represents strobe times, in nanoseconds, from the selected dynamic reference point. Three cycles are shown.

The histogram shown in FIG. 9 reveals that the best strobe time for the example is 8 ns, at which strobe time no mask cycles are observed.

Figure 8:
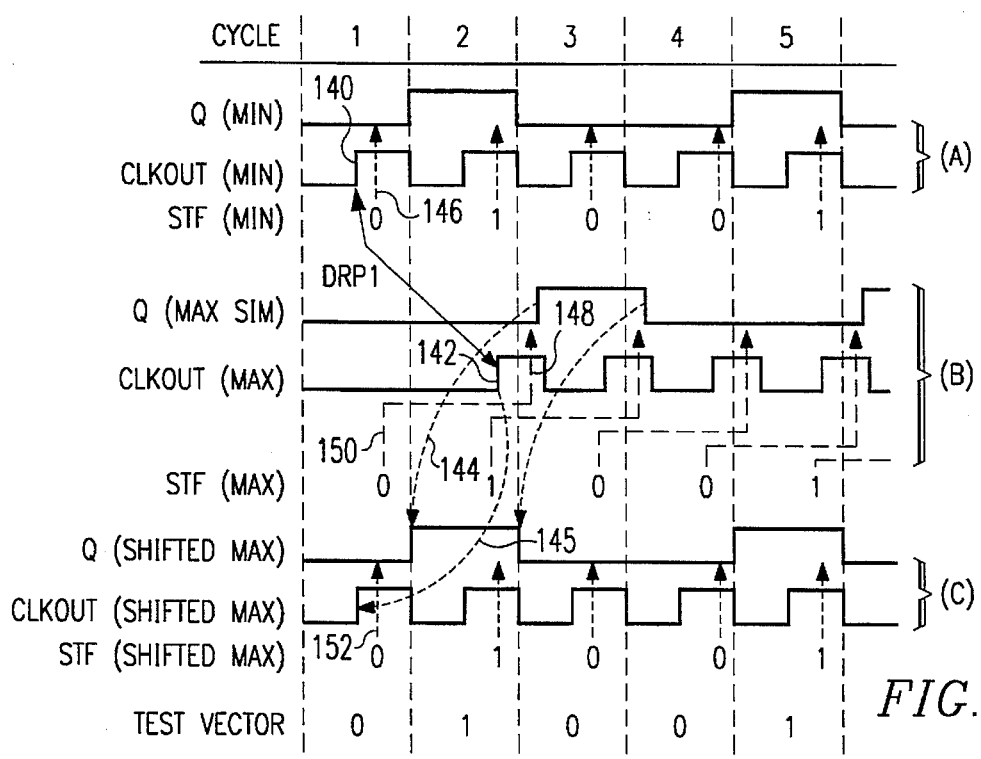
FIG. 8(A)–(C) is a signal timing diagram demonstrating the testability impact of the application of the preferred embodiment of the present invention on test methodologies of the kind discussed herein.

The analysis works on a cycle by cycle basis for prior art clock-in signals. Signals using a dynamic reference point are handled, as mentioned above, by extending the window used for the analysis routine; the best strobe point can be selected anywhere within the new window. The starting point of the new window is determined by normalizing the Min and Max Simulation Trace Files as illustrated in FIG. 8. The window size is determined by the maximum number of tester cycle delays that can be accommodated by the tester hardware. For example, a given tester may have only a four-deep data buffer. In such a case, delay could be set to four cycles. Longer delay would probably require modification to the tester.

An example of the content of a file including intermediate test vectors for the foregoing example, discussed above in connection with FIG. 8 is shown in the following Listing 1:

---

LISTING 1

Line
File Code

1. [IDENTIFICATION DATA]
2. SIGNAL IDENTIFICATION DATA:
3.    SIGNAL = ( D, Q, CLK, CLKOUT )
4.    TYPE = ( IN, OUT, IN, OUT )
5.    PERIOD = 200.00 NS
6. SIGNAL TIMING DATA:
7.    SIGNAL D: OFFSET = 0 NS
8.    SIGNAL CLKOUT: OFFSET = 150 NS
9.    SIGNAL Q: OFFSET = 180 NS
10. CLOCK TIMING DATA:
11.    CLOCK CLK: PATTERN = 010, OFFSET = 50.0 NS,
12.    PULSEWIDTH = 100.0 NS
13.    (*  C  *)
14.    (*  L  *)
15.    (*  K  *)
16.    (*  CO  *)
17.    (*  LU  *)
18.    (*  DQKT  *)
19.    (*  ↓↓↓↓  *)
20. VECTOR DATA:
21.    (*VECTOR 1*)00C1
22.    (*VECTOR 2*)11C1
23.    (*VECTOR 3*)00C1
24.    (*VECTOR 4*)00C1
25.    (*VECTOR 5*)11C1
26. ASIC DYNAMIC TIMING MEASUREMENT DATA:
27.    DRP1 IS MEASURED FROM CLK TO CLKOUT,
28.    MINIMUM ALLOWED VALUE IS 5 NS, MAXIMUM
29.    ALLOWED VALUE IS 50 NS, MEASURE FROM LEADING
30.    CLK EDGE TO A POSITIVE TRANSITION ON CLKOUT
31. DYNAMIC TIMING SIMULATION MEASUREMENT DATA
32.    MINIMUM SIMULATION: DRP1 = ? NS,
33.    NOMINAL SIMULATION: DRP1 = ? NS,
34.    MAXIMUM SIMULATION: DRP1 = ? NS;
35. END;

---

In the above Listing 1, the first line sets forth identification data for the file, according to user preferences/requirements.

Line 2 indicates that signal identification data follows. In connection with this function, line 8 identifies the signals involved in the test controlled by this file, nora ely D, Q, CLK and CLKOUT, and line 4 identifies whether the signal is an input ("IN") or an output ("OUT"). Thus, D is an input, Q is an output, CLK is an input and CLKOUT is an output.

Line 5 sets forth that the repeating period for the test is 200 nanoseconds. This period corresponds to a cycle, e.g., the period defined by the vertical dashed lines in FIG. 8. Every tester has an internal, defined cycle, or period. For this phase of the process of the preferred embodiment, the period is set long enough to avoid ambiguities, as in the prior art. The designer chooses this period.

Line 6 indicates that signal timing data follows. Note that there are two types of signals dealt with, clocks and non-clock signals. Clocks, as is known, are regularly repeating signals, such as CLKOUT in FIGS. 8(A)–(C), which are used to drive logic timing, and may be either an input or an output. They are identified in Listing 1 (as well as in Listing 2 and Listing 3) as CLOCKs. All other signals, including inputs and outputs to the device, are identified in Listing 1 (as well as in Listing 2 and Listing 3) simply as SIGNALs.

Line 7 sets forth that signal D is to be driven at an offset of zero nanoseconds. That offset is with respect to the beginning cycle boundary. Thus, signal D is driven at the cycle boundary.

Line 8 sets forth that signal CLKOUT is to be strobed (the strobe point is the time the signal is measured in the test) at an offset of 150 nanoseconds. Line 9 sets forth that signal Q is to be strobed at an offset of 150 nanoseconds.

Line 10 indicates that dock timing data follows. Lines 11 and 12 set forth that the clock CLK has a repeating patten within each cycle of "0" then "1" then "0", with an offset for the "0" to "1" transition of 50.0 nanoseconds, and the duration of the "1" of 100.0 nanoseconds.

Lines 13 through 19 are comment lines that have no function. They may be used to remind those viewing the file that the sequence of signals is D, Q, CLK, CLKOUT (read down, not across), for the signal values set forth in the same row positions in the test vectors set forth in lines 21 through 25.

Line 20 indicates that the test vectors follow. These test vectors appear in lines 21 through 25. The logic levels for each of the signals D, Q, CLK, CLKOUT, are provided, in that order. Thus, the test vector in line 21 sets forth that in the first period (VECTOR 1) the signals D and Q are low ("0"), the clock CLK is active ("C"), and the signal CLK-OUT is a one ("1"). Likewise, the test vector in line 22 sets forth that in the second period (VECTOR 2) the signals D and Q are high ("1"), the clock CLK is again active ("C"), and the signal CLKOUT is again a one ("1"). The test vector in line 23 sets forth that in the third period (VECTOR 3) the signals D and Q have returned to low ("0"), the dock CLK is still active ("C"), and the signal CLKOUT is still a one ("1"). The test vector in line 24 sets forth that the signals in the fourth period (VECTOR 4) are the same as those in the third period. Finally, the test vector in line 25 sets forth that in the fifth period (VECTOR 5) the signals D and Q are again high ("1"), the clock CLK is still active ("C"), and the signal CLKOUT is still a one ("1").

Line 26 indicates that ASIC dynamic timing measurement data follows. Thus, line 27 sets forth that the dynamic reference point DRP1 is to be measured from CLK to CLKOUT, i.e., DRP1 is CLKOUT, which is to be measured from CLK to determine whether it is within a predetermined (by the designer) allowable range, in this case, as set forth in lines 28 and 29, the minimum allowed value being 5 nanoseconds and the maximum allowed value being 50 nanoseconds. Lines 30 and 31 set forth that these minimum and maximum allowed value are to be measured from the leading clock edge of CLK to a positive transition on CLKOUT.

Line 31 indicates that dynamic timing simulation measurement data follows. Actually, since the file including the data set forth in Listing 1 is run to inform the vector generator of the need to perform the simulated measurement, the lines that follow, lines 32 through 34, are place holders that will have the actual simulation measurement data filled in by the vector generator. Thus, line 32 is a place holder for the minimum simulation run measurement for DRP1, line 33 is a place holder for the nominal simulation run measurement for DRP1 and line 32 is a place holder for the minimum simulation run measurement for DRP1.

Line 35 indicates the end of the listing. Referring again to FIG. 8, relative to lines 26 through 34 of Listing 1, one can see in FIG. 8(A) the measured DRP1 for the minimum simulation run, while in FIG. 8(B) one can see the measured DRP1 for the maximum simulation run.

After the vector generator analyzes the minimum simulation run and the maximum simulation run, a listing will be produced including the information set forth in Listing 2, which is identical to Listing 1, except that it also includes the recorded dynamic reference points measured as a result of processing the file of Listing I and the simulation trace files:

LISTING 2

| Line # | File Code |
|---|---|
| 1. | [IDENTIFICATION DATA] |
| 2. | SIGNAL IDENTIFICATION DATA: |
| 3. | SIGNAL = ( D, Q, CLK, CLKOUT ) |
| 4. | TYPE = ( IN, OUT, IN, OUT ) |
| 5. | PERIOD = 200.00 NS |
| 6. | SIGNAL TIMING DATA: |
| 7. | SIGNAL D: OFFSET = 0 NS |
| 8. | SIGNAL CLKOUT: OFFSET = 150 NS |
| 9. | SIGNAL Q: OFFSET = 180 NS |
| 10. | CLOCK TIMING DATA: |
| 11. | CLOCK CLK: PATTERN = 010, OFFSET = 50.0 NS, |
| 12. | PULSEWIDTH = 100.0 NS |
| 13. | (* C *) |
| 14. | (* L *) |
| 15. | (* K *) |
| 16. | (* CO *) |
| 17. | (* LU *) |
| 18. | (* DQKT *) |
| 19. | (* ↓↓↓↓ *) |
| 20. | VECTOR DATA: |
| 21. | (*VECTOR 1*)00C1 |
| 22. | (*VECTOR 2*)11C1 |
| 23. | (*VECTOR 3*)00C1 |
| 24. | (*VECTOR 4*)00C1 |
| 25. | (*VECTOR 5*)11C1 |
| 26. | ASIC DYNAMIC TIMING MEASUREMENT DATA: |
| 27. | DRP1 IS MEASURED FROM CLK TO CLKOUT, |
| 28. | MINIMUM ALLOWED VALUE IS 4 NS, MAXIMUM |
| 29. | ALLOWED VALUE IS 50 NS, MEASURE FROM LEADING |
| 30. | CLK EDGE TO A POSITIVE TRANSITION ON CLKOUT |
| 31. | DYNAMIC TIMING SIMULATION MEASUREMENT DATA |
| 32. | MINIMUM SIMULATION: DRP1 = 10.0 NS, |
| 33. | NOMINAL SIMULATION: DRP1 = 20.0 NS, |
| 34. | MAXIMUM SIMULATION: DRP1 = 35.0 NS; |
| 35. | END; |

When a file including Listing 2 is run through a test generator adapted to recognize the format described above, an adjusted test file may be generated, that sets forth the new test pattern according to the preferred embodiment. This adjusted test file may be used for the actual test of the DUT. An example of such listing is shown in the following file listing, Listing 3:

Listing 3

| Line # | File Code |
|---|---|
| 1. | [IDENDIFICATION DATA] |
| 2. | SIGNAL IDENTIFICATION DATA: |
| 3. | SIGNAL = ( D, Q, CLK, CLKOUT ) |
| 4. | TYPE = ( IN, OUT, IN, OUT ) |
| 5. | PERIOD = 20.00 NS |
| 6. | SIGNAL TIMING DATA: |
| 7. | SIGNAL D: OFFSET = −8 NS + DRP1 |
| 8. | SIGNAL CLKOUT: OFFSET = 5 NS + DRP1 |
| 9. | SIGNAL Q: OFFSET = 6 NS + DRP1 |
| 10. | CLOCK TIMING DATA: |
| 11. | CLOCK CLK: PATTERN = 010, OFFSET = 5.0 NS, |
| 12. | PULSEWIDTH = 10.0 NS |
| 13. | (* C *) |
| 14. | (* L *) |
| 15. | (* K *) |
| 16. | (* CO *) |
| 17. | (* LU *) |
| 18. | (* DQKT *) |
| 19. | (* ↓↓↓↓ *) |
| 20. | VECTOR DATA: |
| 21. | (*VECTOR 1*)00C1 |
| 22. | (*VECTOR 2*)11C1 |
| 23. | (*VECTOR 3*)00C1 |
| 24. | (*VECTOR 4*)00C1 |
| 25. | (*VECTOR 5*)11C1 |
| 26. | END; |

In the above Listing 3, lines 1 through 4 are the same as in Listings 1 and 2. Here, however, line ti sets the period for the actual test as 20.00 nanoseconds, so that the DUT may be tested at the speed at which the device is expected to operate.

As in Listings 1 and 2, line 6 indicates that signal timing data follows. However, line 7 now sets forth the actual timing parameters for the test of signal D, namely that for the strobe of signal D an offset is given of minus 8 nanoseconds, plus the DRP1 value, whatever DRP1 is determined to be in the measurement. Note that the offset from DRP1 has a negative sign. This means that signal D occurs prior to the DRP1 signal under all conditions, min, nom and max. However, for signals being tested that appear at a time delayed with respect to DRP1, their offset time value with respect to DRP1 will be expressed with a positive value, since their strobe point is at a later time than DRP1. Thus, in line 7 it is seen that signal D is tested with a strobe referenced to DRP1, but offset by −8 nanoseconds. Therefore, depending on the relationship of the signal to the dynamic reference point DRP1, the resultant offset will be either positive or negative.

Line 8 provides the offset for CLKOUT, which is tested with a strobe referenced to DRP1, but offset by 5 nanoseconds. Note that even though CLKOUT is itself the dynamic reference point, it, too, is provided with a strobe point for test referenced to the dynamic reference point. Clearly, since this strobe point for CLKOUT is referenced with respect to itself, this cannot be used for a timing test. However, it can be used for a level test, to verify that proper signal levels are being achieved by CLKOUT.

Line 9 provides the offset for signal Q, timings for which were discussed above in connection with FIG. 8(A)–(C). Like CLKOUT, signal Q is tested with a strobe referenced to DRP1, however offset by 6 nanoseconds.

Lines 10 through 12 are similar to lines 10 through 12 of Listings 1 and 2. However, the timings are modified to account for the different period for Listing 3 (see line 5).

Although lines 13 through 25 are the same as those in Listings 1 and 2, they are not required to be the same.

Typically, the intermediate test vectors in Listings 1 and 2 will be the minimum number of vectors required to make the DRP measurement. The final test vectors shown in Listing 3 contain the entire set of vectors required to fully test the device. The lines appearing in Listing 1 and/or 2 and not appearing in Listing 3, e.g., lines 26 through 34 in Listing 1, are not necessary at this point, having been used to generate the values now set forth in lines 7 through 9 of Listing 3.

Note that the foregoing file listings are in a format, or language, that is arbitrary. Any suitable format or language may be employed to express in files the values and relationships discussed above in connection with Listings 1, 2 and 3. Such language will, in general, be specific to a particular design/test system, and expression of the foregoing listings in such language is well within the skill of ordinary routines in this art, once the principles set forth herein are understood.

Using such a file including instructions such as that in lines 32-34 of Listing 1 to generate a file including a statement such as that in lines 12-13 of Listing 1 involves the implementation of modifications to the vector generator program. Note that the particular language used to implement these modifications may be any of various such languages as are used to express a vector generator program. Writing such code, as with the writing of files according to the listings discussed above, is likewise well within the abilities of ordinary routines in this art, once the considerations set forth herein are understood.

The modifications implement the following:

If dynamic reference point signals are used, then a timing reference template is to be used. This template simply defines the dynamic reference point signals. The timing for non-dynomic (prior art) reference point signals are learned or optimized, as in the prior art. One or more reference test vectors are required in order for the vector generator to determine the minimum simulation, nominal simulation and maximum simulation values of the dynamic reference point signal variables.

One way user interface could be handled in implementing the preferred embodiment could involve the vector generator accepting, initially, a partial optional timing reference template, e.g., Listing 1, and generating an optimized timing reference template. This optimized timing reference template could have the information set forth in Listing 3, less the test vectors and associated comment lines (lines 20 through 25). The timing for any signal defined in the optional timing reference template could be copied to the output timing reference template. These timings could either be generated automatically by the vector generator program, or the user could force them to predetermined values, by, e.g., providing them as inputs. When dynamic reference point signal variables are present in the optional timing reference template, the user must supply one or more reference dynamic reference point test vectors, with desired simulation values.

The basic modification that the vector generator must implement is the shifting in time of the simulation trace file timings of signals involved in dynamic reference point testing, as described hereinabove. This, in general, will involve the addition of code to the vector generator that will recognize the format of the listings provided in accordance with Listings 1 and 2, above, and use the data provided in such listings. Thus, for a listing in accordance with Listing 1, the vector generator program needs to recognize the lines corresponding to lines 26 through 34, calculate, using existing, prior art signal analysis functional capability for measuring the delay between two signal edges, and provide in an output listing such calculated values, as in Listing 2.

Then, the aforementioned time shift of relevant signals is performed, by simple arithmetic (addition or subtraction) operation on the relevant time calculations involved in dynamic reference point testing. Thus, in the case of the strobe time found in line 7 in Listing 3, the implementer of the preferred embodiment will modify and/or supplement the vector generator code to perform the addition/subtraction of DRP1 and the additional incremental offset interval, for example a subtraction of 8 nanoseconds in line 7 in Listing 3. The resultant timings are used by the vector generator program in accordance with its existing, prior art functional capability to perform desired operations.

Finally, note that while generating the test vectors, if the strobe for an output falls beyond the end of the last test vector, the output should be simply masked for that vector. Otherwise, invalid data can result. For example, according to some rules the value used in such cases would be the same as the last known value, from the last period of the test vector. However, because simulation stopped at that last period of the test vector, there is no way to guarantee that the signal to be found at such later period should be such retained value.

It should be noted that, as is known, test vector generation is a well known art, in general. Several embodiments of test generators are available commercially from a number of sources, and extensive literature is available about the theory, construction and operation of test vector generators. As discussed above, those of ordinary skill in the art area to which the present invention pertains will be readily able to implement the algorithms set forth hereinabove in such test vector generators, once the principles of the present invention, as set forth herein, are understood.

Although the present invention and its advantages have been described in detail, it should be understood that various changes, substitutions and alterations can be made herein without departing from the spirit and scope of the invention as defined by the appended claims.

What is claimed is:

1. A method for testing an integrated circuit using a tester, the tester having internal periods for timing reference, the integrated circuit having one or more input ports, one or more output ports and a logic circuit disposed between the input ports and the output ports, wherein the tester applies an input signal to one or more of the input ports, the input signal being synchronous to the internal periods of the tester, such that, by the operation of the logic circuit, an output signal appears at one or more of the output ports, comprising the steps of:

selecting a first output port having a predetermined signal event that occurs at said first output port during a predetermined time range, said predetermined time range being determined with respect to said internal period; and using said predetermined signal event as a timing reference for a test event of said integrated circuit, said test event occurring a predetermined time interval from said predetermined event.

2. A method according to claim 1 wherein said test event is the testing of a second port of said integrated circuit to determine whether a signal appears at said second port at a predetermined logic level.

3. A method according to claim 1 wherein said test event is the testing of said first port of said integrated circuit to determine whether a signal appears at said second port at a predetermined logic level.

4. A method according to claim 1 wherein said test event is the driving of a second port of said integrated circuit to a predetermined logic level.

5. A method according to claim 1 wherein said internal period is synchronous with a clock signal appearing at one of the output ports.

6. A method according to claim 1 wherein said internal period is synchronous with a clock signal appearing at one of the input ports.

7. A method for testing an integrated circuit using a tester, the tester having regularly recurring internal periods for timing reference, said internal periods being synchronous with a clock signal of said integrated circuit, the integrated circuit having one or more signal input ports, one or more signal output ports and a logic circuit disposed between the input ports and the output ports, wherein an input signal applied to one or more of the input ports results, from the operation of the logic circuit, in an output signal appearing at one or more of the output ports, comprising the steps of:

selecting a first output port to use as a reference port;

determining whether a predetermined signal event occurs at said first output port during a predetermined time range; and if said predetermined signal event occurs at said first output port during said predetermined time range, using said predetermined signal event as a timing reference for a test event of said integrated circuit, said test event occurring a predetermined time interval from said predetermined event.

8. A method according to claim 7 wherein said test event is the testing of a second port of said integrated circuit to determine whether a signal appears at said second port at a predetermined logic level.

9. A method according to claim 7 wherein said test event is the driving of a second port of said integrated circuit to a predetermined logic level.

10. A method according to claim 7 wherein said internal period is synchronous with a clock signal appearing at one of the output ports.

11. A method according to claim 7 wherein said internal period is synchronous with a clock signal appearing at one of the input ports.

12. A method for testing an integrated circuit using a tester, the tester having regularly recurring internal periods for timing reference, said internal periods being synchronous with a clock signal of said integrated circuit, the integrated circuit having one or more signal input ports, one or more signal output ports and a logic circuit disposed between the input ports and the output ports, wherein an input signal applied to one or more of the input ports results, from the operation of the logic circuit, in an output signal appearing at one or more of the output ports, comprising the steps of:

selecting a first output port having a first predetermined signal event that occurs at said first output port during a first predetermined time range, said first predetermined time range being determined with respect to said internal period;

selecting a second output port having a second predetermined signal event that occurs at said first output port during a second predetermined time range, said second predetermined time range being determined with respect to said internal period;

using said first predetermined signal event as a first timing reference for a first test event of said integrated circuit, said first test event occurring a first predetermined time interval from said first predetermined event; and using said second predetermined signal event as a second timing reference for a second test event of said integrated circuit, said second test event occurring a second predetermined time interval from said second predetermined event.

13. A method according to claim 12 wherein:

said first test event is the testing of a third port of said integrated circuit to determine whether a signal appears at said second port at a first predetermined logic level; and said second test event is the testing of a fourth port of said integrated circuit to determine whether a signal appears at said second port at a second predetermined logic level.

14. A method according to claim 12 wherein:

said first test event is the driving of a third port of said integrated circuit to a first predetermined logic level; and said second test event is the driving of a fourth port of said integrated circuit to a second predetermined logic level.

15. A method according to claim 12 wherein said internal period is synchronous with a clock signal appearing at one of the output ports.

16. A method according to claim 12 wherein said internal period is synchronous with a clock signal appearing at one of the input ports.

17. A method for testing an integrated circuit using a tester, the tester having regularly recurring internal periods for timing reference, said internal periods being synchronous with a clock signal of said integrated circuit, the integrated circuit having one or more signal input ports, one or more signal output ports and a logic circuit disposed between the input ports and the output ports, wherein an input signal applied to one or more of the input ports results, from the operation of the logic circuit, in an output signal appearing at one or more of the output ports, comprising the steps of:

selecting a first output port to use as a first reference port;

selecting a second output port to use as a second reference port;

determining whether a first predetermined signal event occurs at said first output port during a first predetermined time range;

determining whether a second predetermined signal event occurs at said second output port during a second predetermined time range;

if said first predetermined signal event occurs at said first output port during said first predetermined time range, using said first predetermined signal event as a timing reference for a first test event of said integrated circuit, said first test event occurring a first predetermined time interval from said first predetermined event if said first predetermined signal event occurs at said first output port during said first predetermined time range, using said first predetermined signal event as a timing reference for a first test event of said integrated circuit, said first test event occurring a first predetermined time interval from said first predetermined event; and if said second predetermined signal event occurs at said second output port during said second predetermined time range, using said second predetermined signal event as a timing reference for a second test event of said integrated circuit, said second test event occurring a second predetermined time interval from said second predetermined event.

18. A method according to claim 17 wherein:

said first test event is the testing of a third port of said integrated circuit to determine whether a signal appears at said second port at a first predetermined logic level; and said second test event is the testing of a fourth port of said integrated circuit to determine whether a signal appears at said second port at a second predetermined logic level.

19. A method according to claim 17 wherein:

said first test event is the driving of a third port of said integrated circuit to a first predetermined logic level; and said second test event is the driving of a fourth port of said integrated circuit to a second predetermined logic level.

20. A method according to claim 17 wherein said internal period is synchronous with a clock signal appearing at one of the output ports.

21. A method according to claim 17 wherein said internal period is synchronous with a clock signal appearing at one of the input ports.

22. A method for generating one or more test vectors usable for testing an integrated circuit using a tester, the tester having regularly recurring internal periods for timing reference, said internal periods being synchronous with a clock signal of said integrated circuit, the integrated circuit having one or more input signals, one or more output signals and a logic circuit disposed between the input signals and the output signals, wherein an input signal results, from the operation of the logic circuit, in an output signal, comprising the steps of:

providing a vector generator, the vector generator receiving as an input one or more simulation trace files and providing as an output one or more test vectors;

providing a template file to the vector generator, the template file identifying a dynamic reference point output signal and a signal to be tested;

causing the vector generator to, in response to the template file, determine a time, relative to the internal period at which the reference point output signal occurs;

causing the vector generator to generate a file including one or more test vectors for the test of the signal to be tested, and including an offset value representing a time interval from the dynamic reference point output signal at which the test of the signal to be tested is to be done.

23. A method for testing an integrated circuit using a tester, the tester having internal periods for timing reference, the integrated circuit having one or more input ports, one or more output ports and a logic circuit disposed between the input ports and the output ports, wherein the tester applies an input signal to one or more of the input ports, the input signal being synchronous to the internal periods of the tester, such that, by the operation of the logic circuit, an output signal appears at one or more of the output ports, comprising the steps of:

selecting a first output port having a predetermined signal event that occurs at said first output port during a predetermined time range, said predetermined time range being determined with respect to said internal period;

using said predetermined signal event as a timing reference for one or more test events of said integrated circuit, said test event occurring a predetermined time interval from said predetermined event; and using said internal periods as alternate timing references for test events.

24. A method for testing an integrated circuit using a tester, the tester having internal periods for timing reference, the integrated circuit having one or more input ports, one or more output ports and a logic circuit disposed between the input ports and the output ports, wherein the tester applies an input signal to one or more of the input ports, the input signal being synchronous to the internal periods of the tester, such that, by the operation of the logic circuit, an output signal appears at one or more of the output ports, comprising the steps of:

selecting a first output port having a first predetermined signal event that occurs at said first output port during a first predetermined time range, said first predetermined time range being determined with respect to said internal period; and using said first predetermined signal event as a first timing reference for a first test event of said integrated circuit, said first test event occurring a first predetermined time interval from said first predetermined event;

selecting a second output port having a second predetermined signal event that occurs at said second output port during a second predetermined time range, said second predetermined time range being determined with respect to said internal period; and using said second predetermined signal event as a second timing reference for a second test event of said integrated circuit, said second test event occurring a second predetermined time interval from said second predetermined event.

25. A method according to claim 24 further comprising the step of using said internal periods as alternate timing references for test events.

* * * * *